United States Patent
Yamada et al.

[19]

[11] Patent Number: 6,127,622
[45] Date of Patent: *Oct. 3, 2000

[54] SOLAR CELL MODULE

[75] Inventors: Satoru Yamada, Kyotanabe; Takahiro Mori, Ikoma; Ichiro Kataoka, Kyotanabe; Hidenori Shiotsuka; Ayako Shiotsuka, both of Nara, all of Japan

[73] Assignee: Canon Kabushiki Kaisha, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 09/008,288

[22] Filed: Jan. 16, 1998

[30] Foreign Application Priority Data

Jan. 21, 1997 [JP] Japan ................................ 9-008287

[51] Int. Cl.$^7$ .................................................. H01L 25/00
[52] U.S. Cl. ........................................ 136/251; 136/259
[58] Field of Search ..................................... 136/259, 251

[56] References Cited

U.S. PATENT DOCUMENTS

| | | | |
|---|---|---|---|
| 4,295,181 | 10/1981 | Chang et al. | 361/395 |
| 4,371,739 | 2/1983 | Lewis et al. | 136/251 |
| 4,457,578 | 7/1984 | Taylor | 439/801 |
| 4,830,038 | 5/1989 | Anderson et al. | 136/251 |
| 4,899,257 | 2/1990 | Yamamoto | 361/395 |
| 5,001,603 | 3/1991 | Villanueva, III et al. | 361/394 |
| 5,110,369 | 5/1992 | Tornstrom et al. | 136/291 |
| 5,217,540 | 6/1993 | Ogura | 136/251 |
| 5,280,133 | 1/1994 | Nath | 136/251 |
| 5,383,098 | 1/1995 | Ma et al. | 361/818 |
| 5,409,549 | 4/1995 | Mori | 136/244 |
| 5,568,362 | 10/1996 | Hansson | 361/736 |

FOREIGN PATENT DOCUMENTS

| | | |
|---|---|---|
| 0641030 | 3/1995 | European Pat. Off. . |
| 0681335 | 11/1995 | European Pat. Off. . |
| 0521189 | 1/1993 | Germany . |
| 56-165364 | 12/1981 | Japan . |
| 58-43580 | 3/1983 | Japan . |
| 62-54972 | 3/1987 | Japan . |
| WO 93/12636 | 6/1993 | WIPO . |

OTHER PUBLICATIONS

Patent Abstracts, Japan, vol. 8, No. 17 (E–223) Jan. 1984 & JP58–180070.

Patent Abstracts, Japan, vol. 10, No. 141 (E–406) May 1986 & JP 61–5583.

Patent Abstracts, Japan, vol. 96, Nov. 10, Oct. 1996 & JP-08-167729.

*Primary Examiner*—Mary Chapman
*Attorney, Agent, or Firm*—Fitzpatrick, Cella, Harper & Scinto

[57] ABSTRACT

A solar cell module comprises a photovoltaic device provided between a surface covering material and a back covering material, wherein the photovoltaic device has an output lead-out terminal extending out of the photovoltaic device, the output lead-out terminal is covered with a resin and has no uncovered portion, and the output lead-out terminal is provided with an output lead-out box at its extended portion.

34 Claims, 5 Drawing Sheets

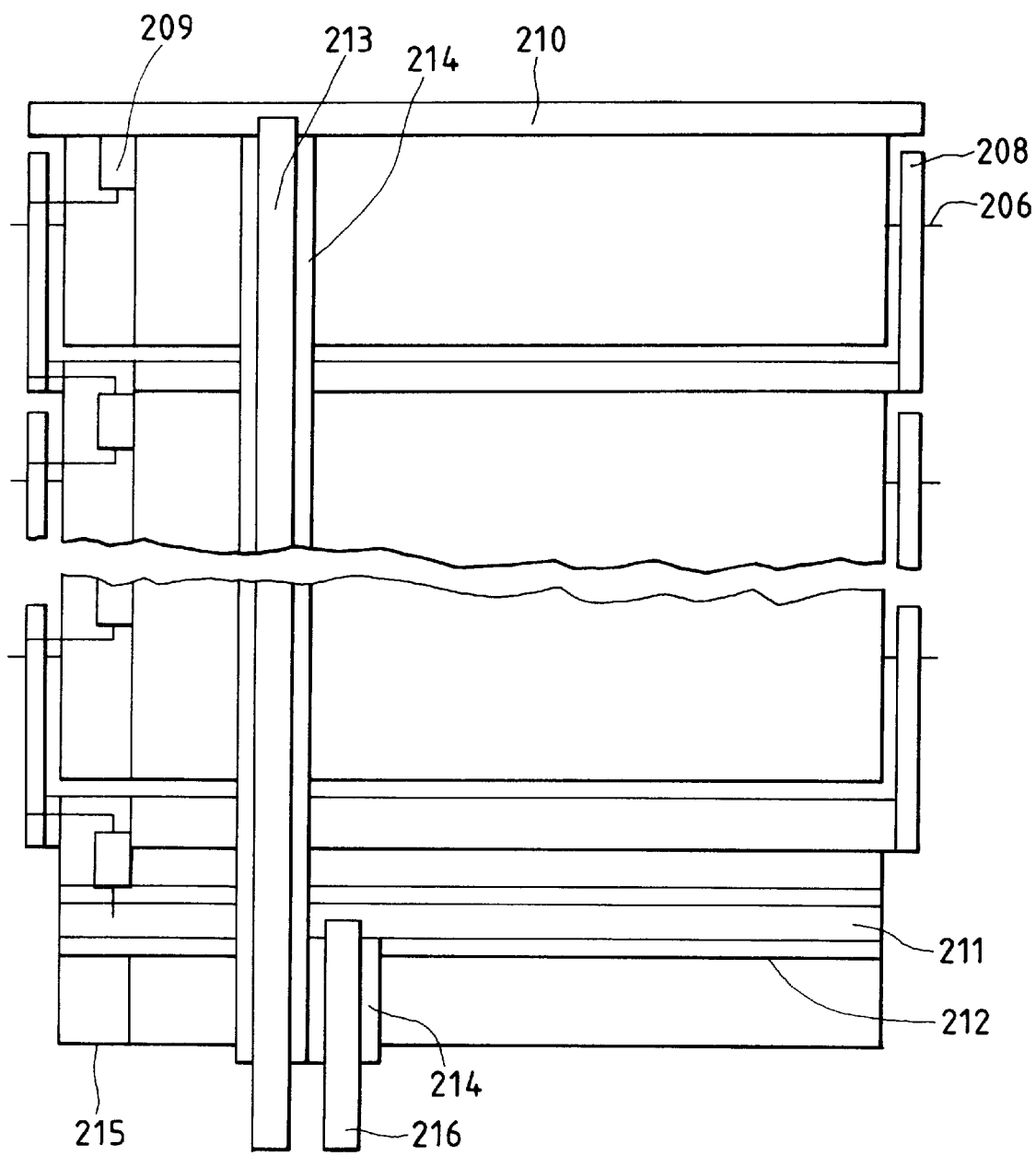

SOLAR CELL MODULE

BACKGROUND OF THE INVENTION

1. Field of the Invention

This invention relates to a solar cell module. More particularly, it relates to a solar cell module that has a high flexibility and superior electrical insulating properties and can prevent peeling.

2. Related Background Art

In recent years, thin-film photovoltaic devices are proposed in a large number. They are typified by, e.g., an amorphous silicon thin-film photovoltaic device comprising a conductive substrate and successively superposingly provided thereon an amorphous silicon semiconductor film and a transparent conductive layer, the former functioning as a photovoltaic device.

Solar cell modules incorporated with such photovoltaic devices are light-weight and high in flexibility, and hence can be used as solar cell modules for which single-crystal silicon solar cells or polycrystalline solar cells can be used with difficulty, e.g., as solar cell modules that are portable and usable in enjoying leisure outdoors, or as solar cell modules that are laminated into metal sheets or the like and usable as roof materials.

Such light-weight and high-flexibility solar cell modules are required to have performances which are different from those of solar cell modules permanently installed. In particular, conventional solar cell modules have a problem of insufficient electrical insulating properties for their output lead-out boxes attached and problems of water exposure and peeling that accompany the attachment of output lead-out boxes. Thus, it has been sought to provide a means for solving these problems. These problems will be detailed below. (Attachment of output lead-out box)

In order to lead out outputs of a solar cell module to the outside, it is common to provide an output lead-out box at the uncovered portion of an output lead-out terminal. Since the solar cell modules permanently installed do not undergo any dynamic force after installation, output lead-out boxes are fastened with adhesives. On the other hand, portable solar cell modules undergo dynamic force, e.g., someone may pull output cables and may walk on output lead-out boxes. Accordingly, the output lead-out box can not have a sufficient mechanical strength if it is only attached with an adhesive. Hence, a method is employed in which the output lead-out box is fastened with bolts and nuts.

When, however, the output lead-out box is fastened with bolts and nuts, concaves or convexes are made on the bottom surface, and hence may cause difficulties such that they catch on something when carried.

Accordingly, one may contemplate to provide projections on the output lead-out box and make holes in the solar cell module so that the projections of the output lead-out box are inserted into the holes to fasten. In this instance, however, water may enter through the holes. Especially when the portions to be fastened are covered with nonwoven fabric in order to ensure the strength at such portions, the water tends to enter along the nonwoven fabric at the holes. Also, portable modules are used, e.g., at the sea or river in many cases. In particular, solar cell modules containing foam can float on water, and are sometimes used in a state where they are floated on water, so that the output lead-out box may, e.g., be swept over by the waves to sink in water. Output lead-out boxes used in such an environment are different from the solar cell modules permanently installed, and are required to have more electrical insulating properties than those used in roof materials.

However, if the nonwoven fabric is removed, the solar cell module has an insufficient strength to cause a problem that, when a force is applied to the output lead-out box, the fastening holes may break to make the output lead-out box tend to be unfastened. In the case of the portable solar cell modules, holes are sometimes made in the solar cell module at its portion having no photovoltaic device so that the solar cell module can be simply fastened with ropes or the like. If the nonwoven fabric is removed from the ends of such a module, the module has an insufficient strength at the holes to cause, e.g., a problem that an external force such as a wind may crack the module from the holes when it is fastened with ropes or the like. (Solar cell modules with foams formed by foaming solid foaming materials in the step of covering)

In solar cell modules having a flexibility, foams are often integrally formed taking account of the buoyancy in water. To form such foams, a solid foaming material may be laminated together with a covering material, which are then foamed in the step of integration to obtain a foamed product. However, a filler constituting the covering material tends to be thinly provided at the edges of the solar cell module. At the edges of a solar cell module making use of nonwoven fabric as a countermeasure therefor, the nonwoven fabric may be provided in a large quantity with respect to the filler, to cause a problem that it tends to peel. The nonwoven fabric also has these problems inherently.

SUMMARY OF THE INVENTION

An object of the present invention is to provide a solar cell module that has a high flexibility and superior electrical insulating properties and can prevent solar cell module constituent materials from peeling at their interfaces.

The present inventors made extensive studies in order to solve the above problems. As the result, they have found the following solar cell module to be best.

A solar cell module comprising a photovoltaic device provided between a surface covering material and a back covering material, wherein;

the photovoltaic device has an output lead-out terminal extending out of the photovoltaic device;

the output lead-out terminal is covered with a resin and has no uncovered portion; and the output lead-out terminal is provided with an output lead-out box at its extended portion.

The output lead-out box may have a projection, and the projection is inserted to a hole provided in the surface covering material to fasten the box.

At least one of the surface covering material and the back covering material may contain a nonwoven fabric, and the solar cell module has no nonwoven fabric at its portion provided with the hole.

BRIEF DESCRIPTION OF THE DRAWINGS

FIGS. 2A, 2B and 2C are schematic illustrations of the constitution of a photovoltaic device used in the solar cell module according to the present invention.

DESCRIPTION OF THE PREFERRED EMBODIMENTS

Figure 1A:
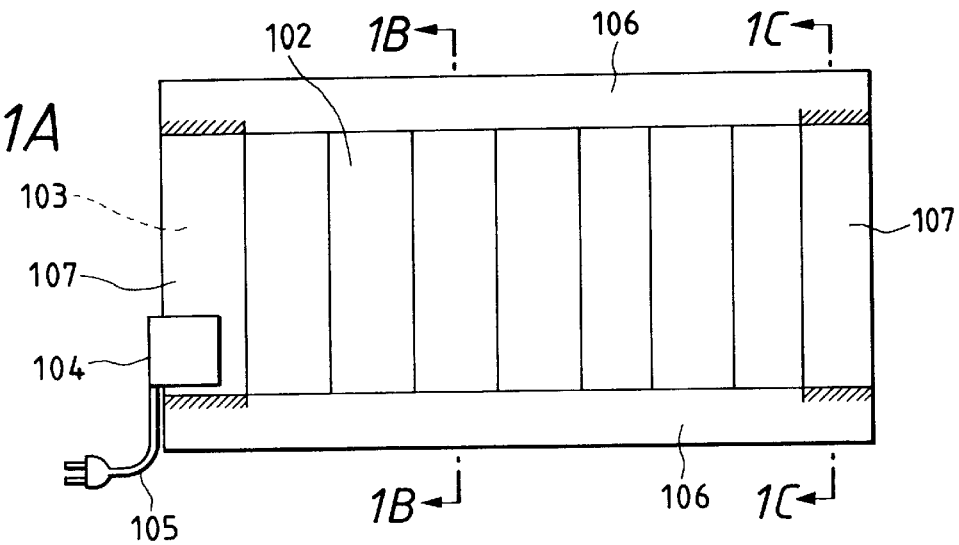
FIGS. 1A, 1B and 1C are schematic illustrations of an example of the constitution of the solar cell module according to the present invention.
Figure 1B:
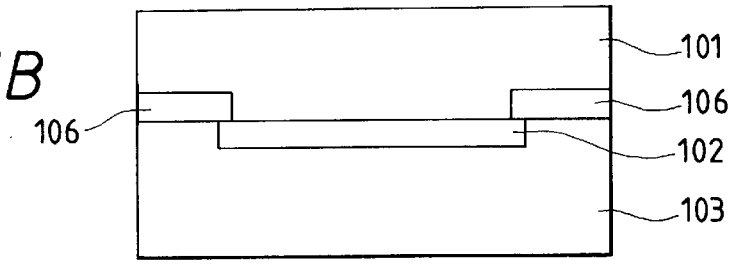
Figure 1C:
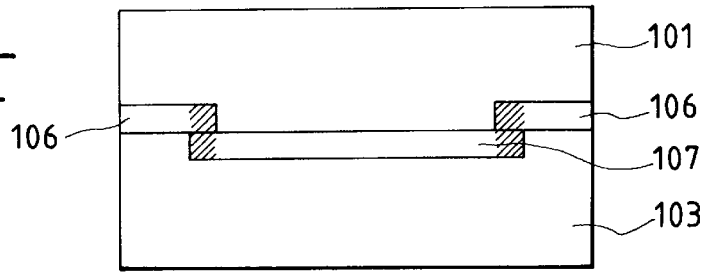

FIGS. 1A to 1C schematically illustrates the constitution of the solar cell module according to the present invention. FIG. 1A is a plan view. FIG. 1B is a cross section at the part along the line 1B—1B in FIG. 1A, and FIG. 1C is a cross section at the part along the line 1C—1C in FIG. 1A. Hereinafter, reference numerals common to all the drawings denote like members.

In FIGS. 1A to 1C, reference numeral 101 denotes a surface covering material; 102, a photovoltaic device; 103, a back covering material; 104, an output lead-out box; and 105, an output lead-out cord. The back covering material 103 is constituted of a filler, an insulating material and a protective film or a reinforcing sheet. It may have a foam for providing buoyancy to the solar cell module. Reference numerals 106 and 107 denote light-screening materials disposed around the photovoltaic device. The light-screening materials overlap each other at the portions shaded in the drawings. The surface covering material 103 has a filler and a surface film, and a nonwoven fabric is buried in the filler. The nonwoven fabric has such a shape that it covers at least the surface of the photovoltaic device 102.

Figure 3A:
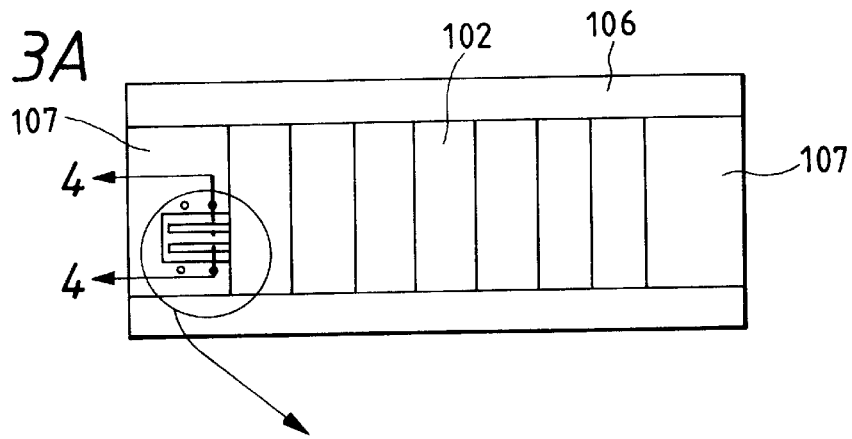
FIGS. 3A, 3B, 3C and 3D are schematic illustrations to describe output lead-out terminals and their vicinity, of the solar cell module according to the present invention.
Figure 3B:
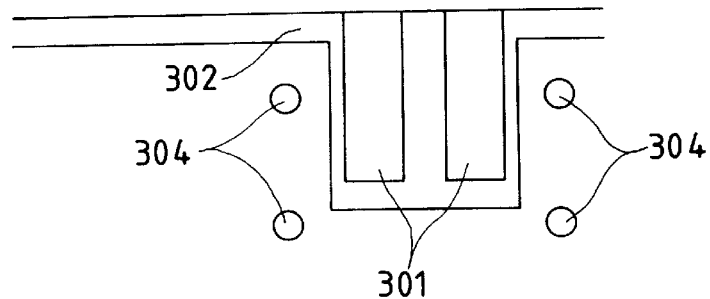
Figure 4:
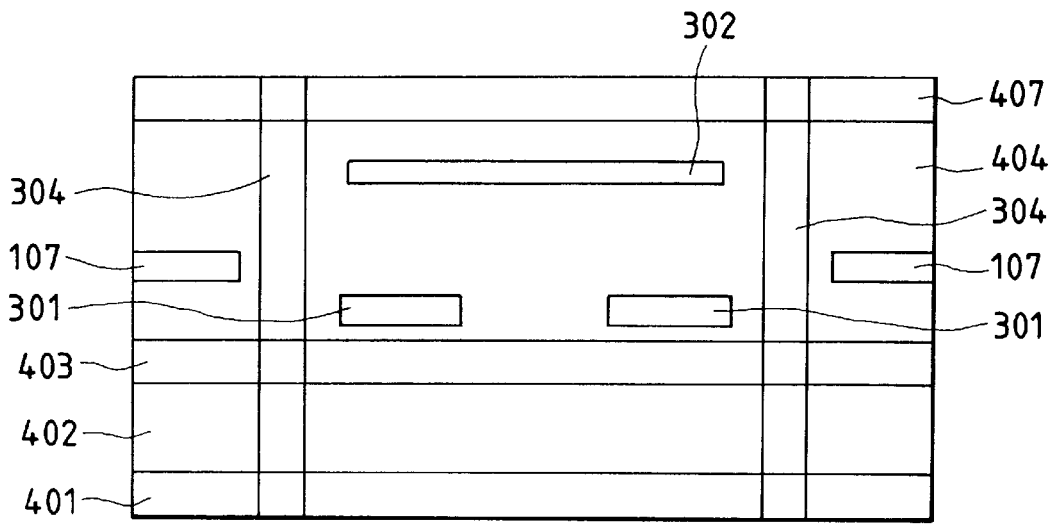
FIG. 4 is a cross section along the line 4—4 in FIG. 3A.

FIG. 3A shows a solar cell module standing before the output lead-out box 104 shown in FIG. 1A is attached. FIG. 3B is an enlarged view of FIG. 3A at its encircled area. FIG. 4 is a cross section along the line 4—4 in FIG. 3A.

The output lead-out box of the solar cell module according to the present invention and how to attach it will be described below.

(Output Lead-Out Box)

The output lead-out box 104 according to the present invention protects the portion at which the output of the photovoltaic device is led out to the outside. It protects the portion where output lead-out terminals are connected to a lead-out wire, from any force externally applied and the water content entering from the outside. The output lead-out box 104 is also required not to be broken even when trod or kicked and not to deteriorate against light and water content.

Figure 3C:
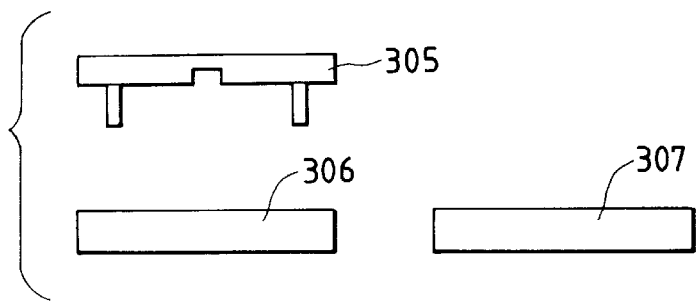
Figure 3D:
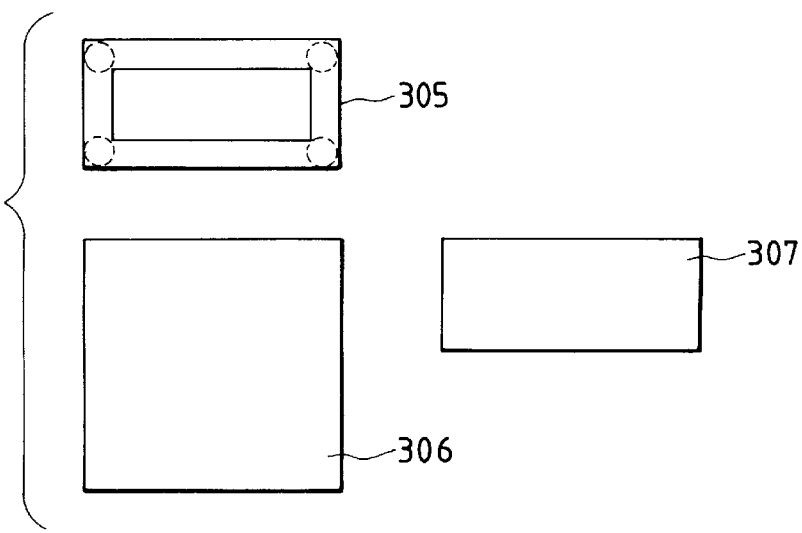

The output lead-out box used in the present invention may have any shape, provided that it has projections for its attachment. As an examples thereof, an output lead-out box will be described which comprises three members as shown in FIGS. 3C and 3D, i.e., an output lead-out box fastening component 305, a top cover 306 and a bottom cover 307. FIG. 3C shows side views of the components 305, 306 and 307, and FIG. 3D plan views of the components 305, 306 and 307.

(Output Lead-Out Box Fastening Component 305)

The output lead-out box fastening component 305 has four projections as shown in FIGS. 3C and 3D. The output lead-out box fastening component 305 is fastened to the solar cell module by respectively inserting these four projections into four holes 304 made in the module. The output lead-out box fastening component 305 has on its one side a hole through which a lead-out wire (not shown) soldered to output lead-out terminals 301 is extended outward. The inside of the output lead-out box fastening component 305 thus made up is filled with a sealant to secure insulation from the outside. When the output lead-out box fastening component 305 is fastened to the solar cell module, the projections of the output lead-out box are inserted into the holes of the solar cell module after sealants have been applied to the projections, the part coming into contact with the surface covering material 103 and the part coming into contact with the cord. Thereafter, the sealant is flowed into the inside of the output lead-out box fastening component 305.

(Top Cover 306 and Bottom Cover 307)

The top cover 306 and bottom cover 307 are components with which the output lead-out box fastening component 305 is covered from the top side and back side, respectively, of the solar cell module. The top cover is put on the output lead-out box fastening component 305 and then the bottom cover is put on the opposite side to fasten the box.

(Make-Up in the Vicinity of Output Lead-Out Box)

The output lead-out terminals 301 are used to lead out the outputs of a plurality of photovoltaic devices to the outside. Output lead-out terminals 213 and 216 which will be described later with reference to FIG. 2C corresponds to the portion extended to the outside of the devices.

As shown in FIG. 4, the output lead-out terminals 301 according to the present invention are covered with a filler resin 404. What is meant by being covered with a resin is that the terminals have no unbonded portion other than the portion at the lead-out outlets (not covered with the resin at this portion only) of the output lead-out terminals 301. As a specific means therefor, the light-screening material in the vicinity of the output lead-out terminals 301 is cut away, and the cut portion is covered with the filler resin 404. The filler resin 404 may be the resin that constitutes either the surface covering material or the back covering material. In such an instance, the adhesive interfaces between the covering material and the other materials can be saved and can be free from damage of reliability. As another means, an adhesive may be provided between the light-screening material and the output lead-out terminals.

In order to fasten the output lead-out box, the holes 304 into which the projections of the output lead-out box fastening component 305 are inserted are so formed as to run through the solar cell module. In that instance, it is important for the hole portion to have no nonwoven fabric 302 that may serve as the path though which the water content enters. If the nonwoven fabric is present at the hole portion, the water content having entered through the holes comes along the nonwoven fabric to enter the inside of the solar cell module to cause a lowering of electrical insulating properties. For example, as shown in FIG. 3B, a nonwoven fabric 302 may be used which has such a shape that it covers only the portions of the output lead-out terminals 301 and photovoltaic devices and does not cover, i.e., is absent at, the portion of the holes 304. As another method, large holes (holes with a diameter larger than the holes 304 into which the projections are inserted) may be previously made in the nonwoven fabric at its areas corresponding to the holes 304.

The absence of the nonwoven fabric 302 at the hole portion may be considered to cause a decrease in fastening strength of the output lead-out box fastening component 305, which strength, however, can be compensated by providing the light-screening material 107 in a larger layer thickness.

(Sealant)

The inside of the output lead-out box 104 thus made up is filled with a sealant to secure insulation from the outside. In the solar cell module having a flexibility, it is important for the sealant to have a flexibility. In the solar cell module permanently installed, it is almost unnecessary for them to have a flexibility so long as they are firmly bonded. In the solar cell modules having a flexibility, however, the solar cell modules must be expanded and contracted with the bending of solar cell modules. If they have no flexibility, cohesive failure may occur to allow water content to enter through such portion.

The sealant must also completely cover the connecting portion between the output lead-out terminals and the lead-out wire, and alos the lead-out wire, and hence its fluidity is important. This is because, in the solar cell module permanently installed, their insulation is secured by the hermetic set-up of the output lead-out box, without covering the output lead-out terminal and lead-out wire connecting portion with the sealant because of a possibility of change in the manner of connection, but in the portable solar cell modules the insulation is secured by the sealant.

The sealant used in the present invention may preferably have a good adhesion to the lead-out wire, the surface covering material surface and the output lead-out box. It must be flexible enough to follow up the bending of the solar cell module with a flexibility. Sealants that fulfill these conditions may include, e.g., epoxy resins, silicone resins and polysulfide resins.

The sealant may preferably have a breaking extension of from 100% to 500% after curing. Such a sealant can prevent the surface covering material and so forth from being peeled from the surface even when the solar cell module is bent when used. As the result, since no flow path of water content is formed, the water content can not enter the inside of the module. The sealant may also preferably have a viscosity of from 30 poises to 5,000 poises. Such a sealant can cover the output lead-out terminal and lead-out wire connecting portion and the lead-out wire without any imperfection, so that the sealant can be prevented from internally causing air bubbles or the like.

(Nonwoven Fabric 302)

The nonwoven fabric 302 is contained in the surface covering material 101 and/or the back covering material 103. It has the function to protect the photovoltaic devices from external force such as scratching and simultaneously impart a strength to the solar cell module. Also, when laminating materials are bonded to each other by vacuum lamination, the nonwoven fabric 302 has the action to assist the evacuation at the time of drawing a vacuum and the action to prevent the resin from flowing out.

As previously described, the nonwoven fabric 302 is so provided as to be absent at the portion of the holes 304 for fastening the output lead-out box. Also when the solar cell module has eyelet holes, the nonwoven fabric is so provided as to be absent at the eyelet hole portion so that the water content can be prevented from entering. Also, it does not reach the edges of the module so that the water content can be prevented from entering and end portion of the module can be fusion-bonded by heat. As materials therefor, a material formed by bonding glass fiber or organic fiber with a binder.

(Light-Screening Materials 106 and 107)

The light-screening materials 106 and 107 has the function to cover up connecting members, electrodes and so forth to keep the beauty and simultaneously has the function to impart a strength to the solar cell module.

In particular, it compensates the strength at the portion where the nonwoven fabric is absent. In order to impart the strength, it is preferable for the light-screening materials have a large thickness. Materials with an excessively large thickness, however, may cause curl of the solar cell module. Accordingly, they must have a thickness small enough not to cause the curl. Materials with a thickness of from 25 $\mu$m to 500 $\mu$m makes it possible to cover the connecting portions with the light-screening materials and also to protect the connecting portions from external force. The strength of eyelet holes of the solar cell module can also be improved.

The portions (shaded areas) where the light-screening materials overlap each other as shown in FIG. 1A or 1C may be filled with an adhesive so that the water content can be prevented from entering the inside of the solar cell module through the portions where the light-screening materials 106 and 107 overlap each other.

In addition, the light-screening materials 106 and 107 must have an adhesive force to the filler resin of the surface covering material and back covering material. In some instances, their surfaces may be subjected to coating treatment in order to improve adhesion. Their surfaces must also be free from color changes against light. As materials, colored PET films or the like may be used.

(Insulating Material 403)

An insulating material 403 (FIG. 4) constituting the back covering material 103 has the function to make the solar cell module adhere to the foam and the function to more ensure the insulation of the photovoltaic device from the outside. Other properties required as the insulating material may include electrical insulating properties, mechanical strength, insulating properties at the time of wetting, and heat resistance.

When the adhesion between the insulating material and the photovoltaic device or foam is in a low strength, an adhesive may be used at the interface of these. Structurally, an integral laminate previously formed of an adhesive/insulating material/adhesive is preferred from the viewpoint of operability.

The adhesive used in the present invention may preferably be capable of, as thermal properties, melting at a high temperature and also concurrently cross-linking at a high temperature. However, the cross-linking is not so important when the solar cell module is used for purposes where its temperature rises only to about 80° C.

The insulating material may include, e.g., nonwoven fabric of biaxially oriented polyethylene terephthalate, nylon, glass fiber or resin fiber.

(Foam)

The back covering material 103 may internally have a foam. The foam is obtained by foaming a solid foaming material containing a blowing agent, a cross-linking agent, a filler and so forth in addition to the resin. The blowing agent contained in the solid foaming material decomposes in the step of covering, and generates gas to provide a foam. Since the foam is formed by foaming the solid foaming material in the step of covering, the foaming material can be foamed in the form that follows up the irregular shapes (e.g., by-pass diodes and electrode lead-out wiring) present on the back of the solar cell module. Thus, any voids or the like do not occur that have occurred when a spongy or the like is attached in conventional cases, and a solar cell module with a high reliability can be obtained. As an additional result, it also becomes possible to eliminate the step of attaching a spongy or the like to the back of the solar cell module, which has been conventionally necessary.

In the case of the solar cell module with a flexibility, the foam has the function to protect the back of the solar cell module. Also, since the back is protected by the foam, the solar cell module can float on water. In the case of such a solar cell module, the foam may preferably be constituted of closed cells that may hardly absorb water. The above method making use of a blowing agent is preferred in order to make the closed cells.

The foam is also required to have properties of protecting the solar cell module from any force externally applied. In the case of portable solar cell modules, it is supposed that the solar cell module is trod with shoes when placed in the vicinity of the ground, or it is dragged along the ground when moved. Especially when it is trod with shoes, sand or soil is present at the bottom of the solar cell module, and a force to deform the solar cell module may act on the back. To relieve such a stress, the foam may more preferably be made of a material with good cushioning properties than a material with a high rigidity.

The foam may preferably have a larger thickness than the size of sand or soil. Since, however, foams with an excessively large thickness may cause the problem of curl as previously stated, it may have a thickness of from 1 to 15 mm.

(Resin for Solid Foaming Material)

The resin used in the solid foaming material in the present invention is required to have filling properties or flow properties. For example, in the revised ASTM 4-1238, the standard of flowability is expressed in melt-flow rate. The resin used in the solid foaming material in the present invention may preferably have flow properties of from 1 to 400 dg/minute. If it has flow properties of less than 1 dg/minute, no flow properties are obtainable which are good enough to fill the irregularities on the back of the solar cell module. The flow properties can also be improved by raising temperature in the step of covering, but the filler ethylene vinyl acetate or the like used in the surface covering material may be yellowed to cause a problem of decrease in conversion efficiency of the solar cell module. On the other hand, a resin with flow properties greater than 400 dg/minute can not capture the gas generated from the blowing agent, and the gas may become dissipated outside the module.

The cell structure formed by the gas generated from the blowing agent is also required to have a heat resistance high enough not to be crushed because of the high temperature in the step of covering the solar cell module. Accordingly, as the resin for the solid foaming material, those containing a cross-linking agent are preferred.

The resin for the solid foaming material is still also required to be made into a foam during the step of covering and besides to have a bond strength to the insulating material and the reinforcing sheet. It must have polar groups to a certain degree. There are no particular limitations on it so long as it is a material that can fulfill these conditions. As specific materials, it may include natural rubber, styrene-butadiene rubber, chloroprene, ethylene-propylene-diene rubber, ethylene vinyl acetate, and copolymers of ethylene with acrylate such as ethylene-ethyl acrylate.

When an adhesive is separately used, it is possible to use, e.g., polyethylene, polypropylene, polystyrene or ABS resin. Of course, any of these resins may be used in the form of a blend.

(Blowing Agent in Solid Foaming Material)

The solid foaming material may be foamed by, e.g., a method in which gases generated as by-products at the time of chemical reaction are utilized, a method in which a volatile solvent with a low boiling point is mixed or impregnated, a method in which microballoons are incorporated, or a method in which a soluble substance is added and dissolved out. Any methods may be used in the present invention.

In the case of the method in which gases generated as by-products at the time of chemical reaction are utilized, the blowing agent suitably used in the present invention may preferably be an organic blowing agent that can readily form closed cells. The organic blowing agent refers to a material capable of decomposing upon heating to generate gases. The resin constituting the solid foaming material is softened, foamed, and cured to become a foam.

Such a blowing agent is grouped into the organic blowing agent and an inorganic blowing agent.

The inorganic blowing agent may include, e.g., sodium bicarbonate, ammonium bicarbonate, ammonium carbonate and azide compounds. Sodium borohydroxide and light metals can also generate gases, but are dangerous because they have a gas generation temperature of as high as 400 degrees or above or the generated-gas species is hydrogen. Inorganic blowing agents tend to produce open cells, and, when used in the present invention, must be so designed that the water content does not enter the foam, e.g., by water-proofing.

On the other hand, the organic blowing agent is preferred as the blowing agent used in the present invention because it can generate gases by thermal decomposition at an appropriate rate, the gases generated are almost nitrogen, and uniform and fine closed cells can be obtained. Moreover, materials capable of sharply generating gases are preferred.

When the blowing agent has a decomposition temperature greatly different from the temperature used in the step of covering the solar cell module, a blowing auxiliary is used in some cases.

Since it is preferable for the gases to be generated during the progress of cross-linking reaction after the resin is softened, the blowing agent may preferably have a decomposition temperature higher than the softening temperature of the resin and within −40 to +40° C. of one-hour half-life temperature of the organic peroxide cross-linking agent described later. When the foam is formed, the cross-linking of resin may preferably take place ahead, followed by generation of gases.

Such a blowing agent may preferably be added in an amount of from 0.1 to 30 parts by weight.

(Cross-Linking Agent used in Solid Foaming Material)

The portable solar cell modules are sought to be improved in the heat resistance in the step of covering, improved in bond strength to the insulating material, or, when the foam is positioned on the back surface of the solar cell module, improved in mar resistance. Accordingly, the foam may preferably have been cross-linked.

The foam may be cross-linked by a method commonly carried out by radical cross-linking, or by ion cross-linking caused by reaction with a curing agent. As a method that meets the above requirements, the radical cross-linking is preferred.

The radical cross-linking can be grouped into electron-ray cross-linking, radiation cross-linking, chemical cross-linking and so forth. In view of simplicity of the apparatus used, chemical cross-linking is preferably used. In particular, cross-linking caused by an organic peroxide is widely used. In the following, the organic peroxide will be detailed.

The cross-linking caused by an organic peroxide takes place by the mechanism where free radicals generated from the organic peroxide withdraw the hydrogen present in the resin to form C—C bonds. Thermal decomposition, redox decomposition and ionic decomposition are known as methods for activating the organic peroxide. Thermal decomposition is commonly in wide use.

The organic peroxide may be added in an amount of usually from 0.1 to 5% by weight based on the weight of the resin in the foam. The organic peroxide is usually often prescribed according to one-hour half-period temperature. There are no particular limitations on the one-hour half-period temperature of the organic peroxide used in the present invention. However, in view of the fact that compression molding is carried out at a temperature of from about 90 to 150° C. in the case when the resin is chiefly composed of an olefin resin, the organic peroxide may preferably have a one-hour half-period temperature of from 100 to 170° C.

The relationship between decomposition temperature of the blowing agent and decomposition temperature of the cross-linking agent can not strictly prescribed. The organic peroxide may preferably have a one-hour half-period temperature higher than the decomposition temperature of the blowing agent.

(Filler Contained in Solid Foaming Material)

A filler may be added to the solid foaming material as an extender, or as a nucleating agent in order to control the number of cells. Increasing the quantity of the filler can bring about an increase in the number of cells to obtain a dense foam. The nucleating agent may be added in an amount of 1% by weight at most to obtain satisfactory results. Its addition in a larger quantity than that will not bring about an increase in the number of cells.

Rather, for economical reasons, it is possible to add an inexpensive extender. Materials having such nucleating effect may include, e.g., calcium carbonate, clay, talc, magnesium oxide, zinc oxide, carbon black, silicon dioxide, titanium oxide, resinous fine-particle orthoboric acid and talc, alkaline earth metal salts of fatty acids, citric acid, and sodium hydrogencarbonate.

(Protective Film 401)

The solar cell module of the present invention is not permanently fastened and is carried by hand, and can be applied to purposes where solar cells are used only when necessary. For example, it can be used at places such as holiday resorts where no systematic electric wires are laid, or can be used in battery chargers of sail boats or automobiles. For such purposes, flexible and light-weight solar cell modules are needed. More specifically, in order to carry a solar cell module by hand, it may preferably be light-weight, and desirably be foldable or can be rolled up for safekeeping when not used. In such solar cell modules, the back covering material is often used in a severer condition than the solar cell modules of the permanently installed type. More specifically, it may be dragged when carried by hand, or trod by mistake when used.

In order to resist such external force, the foam is employed on the back. In instances where the foam has lower mar resistance and cushioning properties compared with the external force, a protective film 401 may be provided on the outermost back surface. Properties required as the protective film 401 are weatherability, flexibility, water resistance, gasoline resistance and plasticizer migration resistance. Specific materials therefor may include low-density polyethylene, polyethylene copolymers, ethylene vinyl acetate containing, e.g., not more than 30% by weight of vinyl acetate, and polyvinyl chloride, polyester or vinyl fluoride incorporated with a plasticizer. When the adhesion between the protective film and the foam is in an insufficient strength, the both may be bonded with an adhesive or pressure-sensitive adhesive, like the reinforcing sheet.

The protective film 401 is advantageous not only for the protection of the solar cell module but also for the production process. More specifically, it is effective for preventing escape of gases generated when the blowing agent is decomposed. In such an instance too, the adhesive or pressure-sensitive adhesive may be used in combination.

(Filler Resins 402, 404)

The filler resin (an adhesive) 402 and 404 used in the surface covering material 101 and back covering material 103, respectively, may preferably stand dissolved at the initial stage in the step of covering the solar cell module and be cross-linked at the ending stage in that step. The cross-linking may preferably be carried out in the presence of the organic peroxide described above. The cross-linking thus carried out brings about an improvement in the cohesive force of resin in the adhesive to make the adhesive undergo no in-layer cohesive failure. It is possible to make covalent bonds with an interface of the reinforcing sheet or the foam to improve adhesive strength. Specific materials for the adhesive may include an ethylene-vinyl acetate copolymer, an ethylene-ethyl acetate copolymer, polyvinyl butyral, silicone resins and acrylic resins.

When the filler resin has an insufficient adhesive strength, a silane coupling agent or a titanate coupling agent may be used in combination so that the adhesive strength can be enhanced. The adhesive resin constituting the filler resin may also preferably be incorporated with an ultraviolet light absorbent so that the filler resin is endowed with the desired function of ultraviolet light screening. The ultraviolet light absorbent used in such an instance may include organic ultraviolet light absorbents and inorganic ultraviolet light absorbents. The filler resin may preferably be reinforced in order to improve mechanical strength. As a specific material therefor, it is preferable to insert at the time of covering a glass fiber nonwoven fabric or a nonwoven fabric comprised of an organic fiber, or to previously mix a filler such as glass short fiber or glass beads in the resin of the filler resin. However, if the glass fiber comes to the outside, water content may enter through the interface between the glass fiber and the filler resin. Hence, the nonwoven fabric must be absent at the edges of the solar cell module and at the holes for fastening the output lead-out box.

(Surface Film 407)

For a surface film 407 as a surface material, constituting the surface covering material 101, it is important to be stable to heat, light and water content (i.e., have a good weatherability). It is also desirable for the surface material to be stained with difficulty so that the solar cell module can be prevented from causing a lowering of its efficiency. For this purpose, it is also desirable for the surface material to have a water repellency. As this water repellency, the surface material may preferably have a contact angle of water of at least 50 degrees, and more preferably at least 70 degrees. The surface material is constituted of a fluorine resin. Such a fluorine resin may include ethylene-tetrafluoroethylene copolymer (ETFE), trifluorochloroethylene resin (PCTFE), tetrafluoroethylene-perfluoroalkyl vinyl ether copolymers (PFA), tetrafluoroethylene-hexafluoropropylene copolymer (FEP), vinylidene fluoride resin (PVDF) and vinyl fluoride resin (PVF).

The surface material constituted of any of these resins may preferably be subjected to corona discharge treatment, ozone treatment or primer coating in order to ensure its adhesive strength to the filler resin. It is also possible to use a glass coated with a fluorine resin or the like. The part at which the output lead-out box is attached may preferably have been subjected to easy-adhesion treatment. It may be carried out by the same method as the method of enhancing the adhesive strength to the filler resin.

(Photovoltaic Device 102)

Figure 2A:
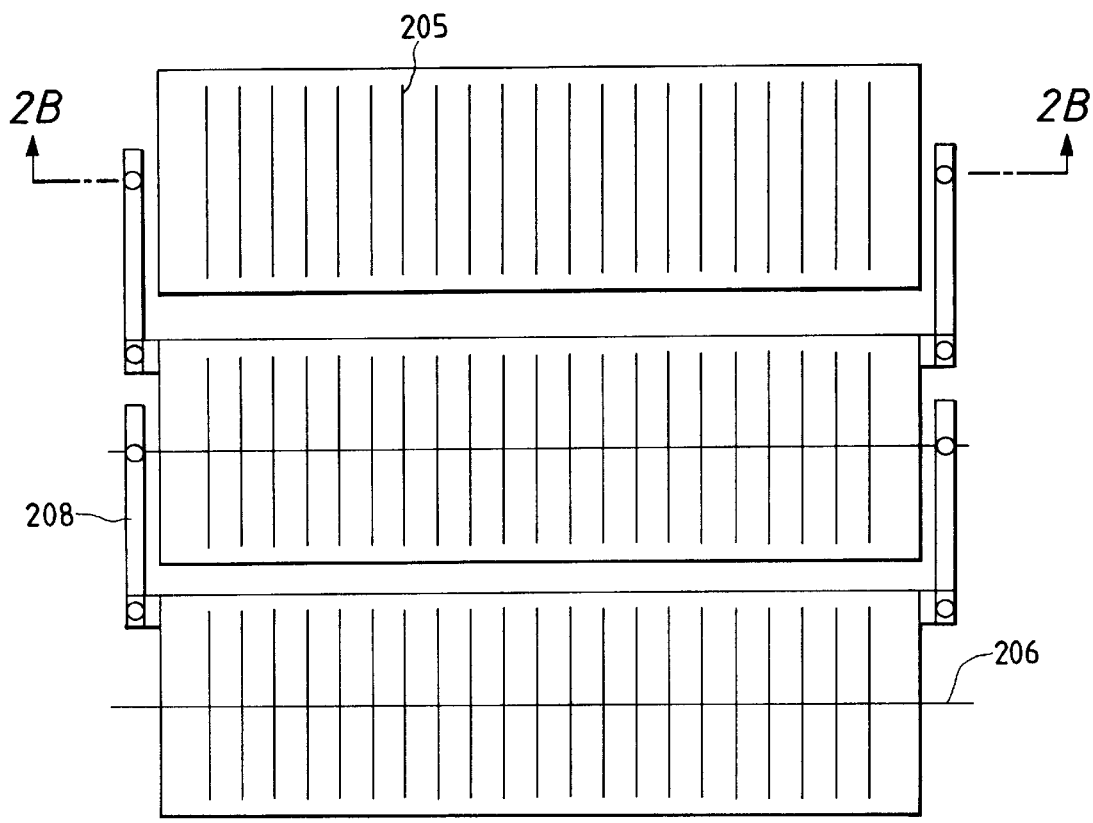
Figure 2B:
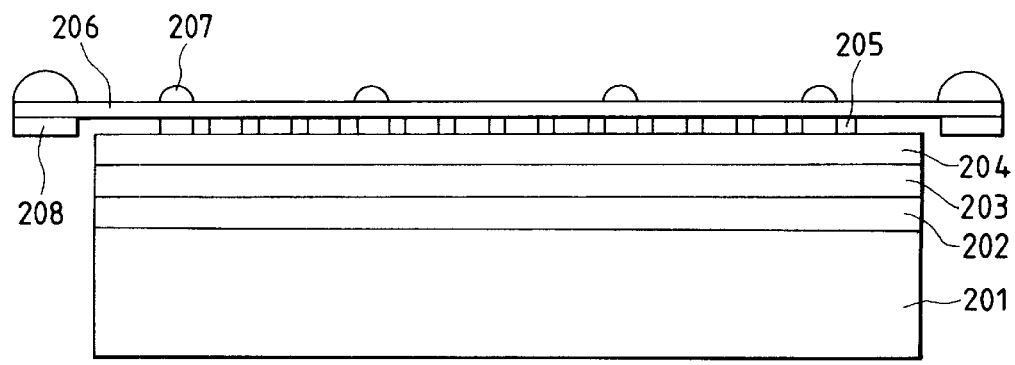

The photovoltaic device 102 according to the present invention is constituted of materials having a flexibility. For example, it is constituted as shown in FIGS. 2A to 2C, where thin-film semiconductor photo-active layers as a photoelectric conversion member are formed on a conductive substrate. FIG. 2A is a plan view of the photovoltaic device, and FIG. 2B is a cross section along the line 2B—2B in FIG. 2A. FIG. 2C is a plan view as viewed from the back of the photovoltaic devices of FIG. 2A which have been made into a module.

On a conductive substrate 201, a back reflective layer 202, a semiconductor photo-active layer 203 and a transparent conductive layer 204 are superposed, and a grid electrode 205 for collecting electricity is formed thereon and is connected to an output lead-out terminal wire bus bar 206 with a silver paste 207. Subsequently with reference to FIG. 2C, the wire bus bar 206 is connected to a plus tab 208. The plus tab 208 is fastened to a minus tab 210 bonded to the back of the conductive substrate 201 of an adjoining photovoltaic device. Copper tabs 208 of adjoining photovoltaic devices are connected with each other through a by-pass diode 209, and the by-pass diode is fastened to the substrate 201 through an insulating tape 215. Finally, a minus terminal 213 and plus terminals 211 and 216 are fastened to the substrate 201 through insulating tapes 212 and 214. According to the constitution of the present invention, the plus terminals and minus terminals can be led out of the same output lead-out box. Also, the output lead-out box can be provided on the surface of the solar cell module.

The conductive substrate 201 serves as the substrate of the photovoltaic device and also plays a role as a lower electrode. Materials therefor may include silicon, tantalum, molybdenum, tungsten, stainless steel, aluminum, copper, titanium, carbon sheets, zinc-coated steel sheets, and resin films or ceramics with conductive layers formed.

On the conductive substrate 201, a metal layer and/or a metal oxide layer may be formed as the back reflective layer 202. To form the metal layer, Ti, Cr, Mo, W, Al, Ag or Ni may be used, for example. To form the metal oxide layer, $ZnO$, $TiO_2$ or $SnO_2$ may be used, for example. The metal layer and metal oxide layer may be formed by a process including resistance heating vacuum deposition, electron beam vacuum deposition, and sputtering.

The semiconductor photo-active layer 203 is a region where the photoelectric conversion takes place. Specific materials therefor may include pn structure polycrystalline silicon, pin structure amorphous silicon, or compound semiconductors including $CuInSe_2$, $CuInS_2$, GaAs, $CdS/Cu_2S$, CdS/CdTe, CdS/InP and $CdTe/Cu_2Te$. The semiconductor photo-active layer can be formed by a process including formation of fused silicon into a sheet or heat treatment of amorphous silicon in the case of polycrystalline silicon; plasma CVD using silane gas or the like as a material in the case of amorphous silicon; and ion plating, ion beam deposition, vacuum deposition, sputtering and electrodeposition in the case of compound semiconductors.

The transparent conductive layer 204 plays a role as an upper electrode of the photovoltaic device. Materials therefor may include $In_2O_3$, $SnO_2$, $In_2O_3$—$SnO_2$ (ITO), ZnO, $TiO_2$, $Cd_2SnO_4$, and crystalline semiconductors doped with impurities in a high density. This layer can be formed by a process including resistance heating vacuum deposition, sputtering, spraying, CVD, and impurity diffusion.

A grid type collector electrode 205 (grid) may be provided on the transparent conductive layer in order to collect electric currents in a good efficiency. Specific materials for the collector electrode 205 may include, e.g., conductive paste prepared by dispersing finely powdered silver, gold, copper, nickel, carbon or the like in a binder polymer. The binder polymer may include resins such as polyester resins, epoxy resins, acrylic resins, alkyd resins, polyvinyl acetate resins, rubber resins, urethane resins and phenol resins. Besides the conductive paste, the collector electrode 205 can be formed by a process including sputtering, resistance heating, CVD making use of a mask pattern; a process in which a metal film is formed by vacuum deposition over the whole surface followed by removal of unnecessary areas by etching to form a pattern; a process in which a grid electrode pattern is directly formed by photo-CVD; a process in which a negative pattern mask of a grid electrode pattern is formed, followed by plating; and a process in which a metal wire is fixed with conductive paste.

The bus bar 206, minus tab 210 and plus tab 208 can be attached to the conductive substrate and collector electrode by a method in which, when they are attached to the conductive substrate, metallic members such as copper tabs are joined by spot welding or soldering. When they are attached to the collector electrode, a method may be employed in which metallic members are electrically connected with a conductive adhesive or solder 207. When they are attached to the collector electrode, it is desirable to provide an insulating material in order to prevent the output lead-out terminals from coming into contact with the conductive substrate or semiconductor layers to cause a short circuit.

Photovoltaic devices fabricated in the manner as described above are connected in series or in parallel in accordance with the desired voltage or electric current. Alternatively, the photovoltaic devices may be integrated on an insulated substrate to obtain the desired voltage or electric current.

EXAMPLES

The present invention will be described below in greater detail by giving Examples. The present invention is by no means limited to these Examples.

Example 1

Figure 5:
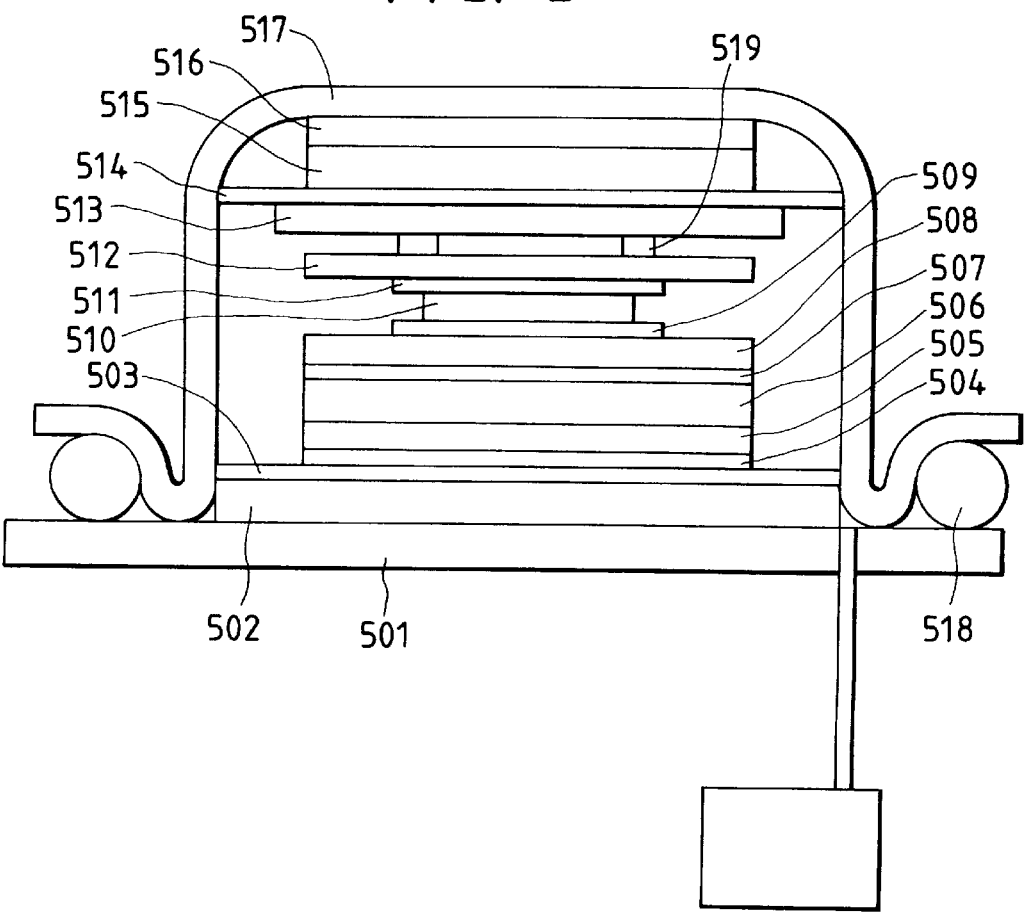
FIG. 5 is a schematic illustration of a process for producing the solar cell module according to the present invention.

In the present Example, a solar cell module comprising the photovoltaic device having the layer configuration as shown in FIGS. 2A to 2C was produced as shown in FIG. 5. Thereafter, the output lead-out box as shown in FIGS. 3A to 3D was provided.

The solar cell module of the present Example was produced by preparing first a member 502 elastically deformable in the thickness direction, an embossed sheet 503, a back film 504, a nonwoven fabric 505, a solid foaming material 506, an insulating material 507, a filler resin 508, a nonwoven fabric 509, a photovoltaic device 510, a nonwoven fabric 511, a filler resin 512, a light-screening material 519, a surface film 513, an embossed sheet 514, a member 515 elastically deformable in the thickness direction and a member 516 with a flexural rigidity, and putting these constituents layer by layer on a laminator plate 501 (a member with a flexural rigidity) as shown in FIG. 5.

In the following, each constituent will be described in detail.

(Filler Resin)

The filler resin 508 as the back covering material and the filler resin 512 as the surface covering material were each produced by mixing 100 parts by weight of ethylene vinyl acetate resin (vinyl acetate: 33% by weight; melt flow rate: 30 dg/min), 1.5 parts by weight of 2,5-dimethyl-2,5-bis(t-butylperoxy)hexane as a cross-linking agent, 0.3 part by weight of 2-hydroxy-4-n-octoxybenzophenone as a UV absorbent, 0.2 part by weight of tris(monononylphenyl)

phosphite as an antioxidant and 0.1 part by weight of (2,2,6,6-tetramethyl-4-piperidyl)sebacate as a photostabilizer, followed by extrusion using a T-die and an extruder.

The back covering material filler resin 508 was formed in a thickness of 230 μm, and the surface covering material filler resin 512 in a thickness of 460 μm.

(Solid Foaming Material)

The solid foaming material 506 was prepared in the following way.

A mixture of 100 parts by weight of ethylene vinyl acetate resin (vinyl acetate: 15% by weight; melt flow rate: 9 dg/min), 40 parts by weight of soft calcium carbonate (primary particle diameter: 3 μm) as a nucleating agent, 5 parts by weight of a mixture of azodicarbonamide and dinitrosopentamethyltetramine as a blowing agent, 1 part by weight of dicumyl peroxide as a cross-linking agent, 0.5 part by weight of stearic acid and 0.1 part by weight of carbon black as a pigment was formed into a sheet with a thickness of 1.5 mm by means of an inverted-L four-roll calender.

(Insulating Material)

As the insulating material 507, a both-side corona-treated biaxially oriented polyethylene terephthalate film (thickness: 50 μm) was used. The treated surface had a wetting index of 53 dyne/cm or above.

(Nonwoven Fabric)

As the nonwoven fabric 505 positioned at the back lower side, an organic nonwoven fabric of polypropylene was used, having a basis weight of 20 g/m², an average fiber diameter of 15 microns and an apparent thickness of 130 μm and containing 3% of poly[{6-(1,1,3,3-tetramethylbutyl) amino-1,3,5-triazine-2,4-diyl}{2,2,6,6-(tetramethyl-4-piperidyl)imino} hexamethylene {(2,2,6,6-(tetramethyl-4-piperidyl)imino}].

As the nonwoven fabric 509 positioned below the photovoltaic device 510, a glass fiber nonwoven fabric as prepared, having a linear diameter of 10 μm, a basis weight of 20 g/m², E glass and a glass fiber diameter of 6 μm and containing 5% of an acrylic binder.

As the nonwoven fabric 511 positioned above the photovoltaic device 510, a glass fiber nonwoven fabric was prepared, having a linear diameter of 10 μm, a basis weight of 80 g/m², E glass and a glass fiber diameter of 6 μm and containing 5% of an acrylic binder.

(Photovoltaic Device)

As the photovoltaic device 510, the one constituted as shown in FIGS. 2A to 2C and fabricated according to the following procedure was used.

(1) First, a cleaned beltlike stainless steel substrate 201 was prepared. On the substrate, an Al layer (layer thickness: 500 nm) and a ZnO layer (layer thickness: 500 nm) were successively formed by sputtering as the back reflecting layer 202.

(2) Next, a tandem type amorphous silicon photoelectric conversion semiconductor layer having a layer configuration of n-type layer (layer thickness: 15 nm)/i-type layer (layer thickness: 400 nm)/p-type layer (layer thickness: 10 nm)/n-type layer (layer thickness: 10 nm)/i-type layer (layer thickness: 80 nm)/p-type layer (layer thickness: 10 nm) was formed by plasma CVD to form the semiconductor photoactive layer 203.

Here, the n-type layer refers to an n-type amorphous silicon (a-Si) layer produced using a mixed gas of $SiH_4$, $PH_3$ and $H_2$. The i-type layer refers to an i-type amorphous silicon (a-Si) layer produced using a mixed gas of $SiH_4$ and $H_2$. Then the p-type layer refers to a p-type microcrystalline silicon (μc-Si) layer produced using a mixed gas of $SiH_4$, $BF_3$ and $H_2$.

(3) As the transparent conductive layer 204, an $In_2O_3$ thin film (layer thickness: 70 nm) was formed by resistance heating vacuum deposition of In in an atmosphere of $O_2$.

(4) One obtained through the above steps (1) to (3) was cut off, followed by etching by screen printing to obtain a plurality of devices of 30 cm×9 cm in size.

(5) From the plurality of devices obtained, thirteen devices were selected, and the grid electrode 205 for collecting electricity was formed on each device by screen printing using a silver paste (trade number: #5007, available from Du Pont Co.).

(6) The collector electrodes were bonded and connected to each other, using the wire bus bar 206 (soldered copper wire with a diameter of 400 μm) and the silver paste 207 (trade number: #220, available from Amicon Co.)

(7) Copper tabs (thickness: 100 μm) were attached to the stainless steel substrate by spot welding. Thus, photovoltaic devices were obtained.

(8) The copper tabs 208 of the thirteen photovoltaic devices thus obtained were soldered to the wire bus bars 206 of the adjoining photovoltaic devices to connect them in series.

(9) To the back of each photovoltaic device, the by-pass diode 209 (2.5 mm diameter) was attached one by one through an insulating tape (thickness: 140 μm; comprising a 100 μm thick polyethylene terephthalate base material and a 40 μm thick pressure-sensitive adhesive layer), and connected to the plus electrode and minus electrode of each photovoltaic device by soldering.

(10) The like insulating tape was further stuck onto the by-pass diodes. To one of the photovoltaic devices positioned at the outermost ends of the photovoltaic devices connected in series, the copper tab 210 for minus output was attached through a double-backed adhesive tape (thickness: 65 μm), and, to the other of them, the copper tab 211 for plus output (thickness: 100 μm) was attached through the insulating tape 212 (thickness: 140 μm; comprising a 100 μm thick polyethylene terephthalate base material and a 40 μm thick pressure-sensitive adhesive layer).

(11) To the copper tab 210 for minus output (thickness: 100 μm), the copper tab 208 of the farthest-end photovoltaic device was soldered. To the copper tab 211 for plus output, the wire bus bar of the opposite-end photovoltaic device was folded and soldered.

(12) To make one-end output, a copper tab 213 was soldered to the copper tab for minus output to extend it, and was stuck to the photovoltaic device through the insulating tape 214 (thickness: 140 μm; comprising a 100 μm thick polyethylene terephthalate base material and a 40 μm thick pressure-sensitive adhesive layer) to form the output lead-out terminal 213 serving as a minus output lead-out terminal. The output lead-out terminal 216 serving as a plus output lead-out terminal was similarly formed.

Through the above steps (1) to (12), the photovoltaic devices 510 used in the present Example were prepared.

(Light-Screening Material)

As the light-screening material 519, a white polyethylene terephthalate film of 125 μm thick was used, and was disposed at the four sides of the photovoltaic devices 510.

(Surface Film)

As the surface film 513, a non-oriented ethylene-tetrafluoroethylene film (thickness: 50 μm) was prepared. Its adhesive surface to the filler resin 507 was previously subjected to corona discharge treatment.

(Embossed Sheet)

As the embossed sheet 503 on the back film side, a chopped strand mat was used, having a basis weight of 450 g/m², a fiber diameter of 17 μm, a secondary fiber bundle length of 400 mm and a fiber length of 100 mm. A PFA film was used in combination in order to prevent the embossed sheet from its contamination due to the flow of filler resin.

As the embossed sheet 514 on the surface film side, a nonwoven fabric of organic fiber (polyester resin) was used, having a fiber diameter of 20 μm and a basis weight of 20 g/m².

(Member Elastically Deformable in the Thickness Direction)

As the member 502 elastically deformable in the thickness direction, provided on the back film side, a chloroprene rubber foam was used, having a compression hardness of 50 according to JIS K6767, a thickness of 8.0 mm and a foam magnification of 30 times. As the member 515 elastically deformable in the thickness direction, provided on the surface film side, silicone rubber was used, having a compression hardness of 70 according to JIS K6767 and a thickness of 2 mm.

(Member with Flexural Rigidity)

As the member 501 with a flexural rigidity on the back film side, an aluminum plate (thickness: 8 mm) of a laminator was used. As the member 516 with a flexural rigidity on the surface film side, a steal sheet (thickness: 0.8 mm) was prepared.

How to produce the solar cell module by covering the photovoltaic device, using the constituent materials described above will be described below.

First, at a given position of a laminator making use of the aluminum plate 501 as the plate, a PFA film (thickness: 50 μm) was stretched for preventing contamination.

Next, on this PFA film, the member 502 elastically deformable in the thickness direction, the embossed sheet 503, the back film 504, the nonwoven fabric 505, the solid foaming material 506, the insulating material 507, the filler resin 508, the nonwoven fabric 509, the photovoltaic device 510, the nonwoven fabric 511, the filler resin 512, the light-screening material 519, the surface film 513, the embossed sheet 514, the member 515 elastically deformable in the thickness direction and the member 516 with a flexural rigidity were successively superposed to form a laminate. On this laminate, a heat-resistant silicone rubber sheet (compression hardness according to JIS K6767: 70; thickness: 2 mm) was put as a partition wall 517.

Next, using an O-ring 518 as a sealing material, the inside of the laminate was evacuated to a vacuum of 2 Torr by means of a vacuum pump. After the inside was continued to be evacuated for 30 minutes, the laminate was put into a 120° C. hot-air drying furnace, and taken out after 100 minutes. Thereafter, it was cooled to room temperature while continuing to draw a vacuum. The degree of vacuum was always kept at 4 Torr or below until the cooling was completed. Thus, a plurality of solar cell modules were produced.

How to attach the output lead-out box to the solar cell module thus produced will be described below with reference to FIGS. 3A to 3D.

As shown in FIGS. 3A and 3B, holes 304 of 3 mm diameter each were made in the vicinity of the output lead-out terminals 301. Next, a lead-out wire (not shown) was soldered to the output lead-out terminals 301, and a silicone sealant (viscosity: 700 poises; hardness after cure: 21; breaking extension: 470%) was coated on the output lead-out box fastening component 305 at its part coming into contact with the solar cell module. The projections of the output lead-out box were inserted into the holes of the solar cell module. As shown in FIG. 3B, the glass fiber nonwoven fabric 302 was so made as to be absent at the holes 304 for attaching the output lead-out box 104. At the portion of the output lead-out terminals 301, the light-screening material 107 was so cut out that the output lead-out terminals 301 are covered with resin.

The inside of the output lead-out box was further filled with a silicone sealant (the same as the above). Thereafter, this was left for 3 days at room temperature, and then the top cover 306 and bottom cover 307 of the output lead-out box were attached.

Finally, holes for handy installation were made at the four corners of the solar cell module to which the output lead-out box had been attached. At positions of 20 mm from every side of the solar cell module, holes of 12 mm diameter were made and provided with eyelets.

The solar cell module produced through the foregoing steps was tested on four items, i.e., on a temperature and relative humidity cycle test, a sea water immersion test, a high-temperature water immersion test and measurement of eyelet strength to make evaluation as described below. Results of evaluation are shown together in Table 1.

(Temperature and Relative Humidity Cycle Test)

On the solar cell module, a temperature and relative humidity cycle test consisting of Set 1 (−40° C./1 hour) and Set 2 (85° C./85% RH/4 hours) was repeated for 200 cycles, and thereafter the appearance of the solar cell module was visually evaluated. Here, the visual evaluation of the appearance was made according to the following criteria.

A: No change is seen at all in the appearance.

B: A little change is seen in the appearance, and internal peeling can be perceived by touch or peeling can be recognized when the module is disassembled.

C: Peeling has occurred.

The solar cell module on which the temperature and relative humidity cycle test was completed was subjected to an insulation test in the manner as described below, to measure its insulation resistance.

(1) First, the anode and cathode of the solar cell module were shorted.

(2) The sample obtained was immersed in a solution with an electrical conductance of 3,500 ohm·cm (containing as a surface-active agent 0.1% by weight of TRITON X-100, trade name, available from Rohm and Haas Co.). When immersed, the portion loaded as above was immersed in the solution in such a way that the output lead-out terminals of the sample were not immersed in the solution.

(3) The cathode of a power source was immersed in the solution, and the anode of the power source was connected to the output lead-out terminals of the sample.

(4) A voltage of 2,200 V was applied from the power source, and its leakage current was measured.

As evaluation in this test, leakage currents are shown in Table 1.

(Sea Water Immersion Test)

The solar cell module was immersed in sea water for 31 days, and thereafter its insulation resistance was measured in sea water. Here, the evaluation of insulation resistance was made according to the following criteria.

A: Insulation resistance is 40 ohms/m² or above.

B: Insulation resistance is less than 40 ohms/m².

(High-Temperature Water Immersion Test)

The solar cell module was immersed in 850° C. water for 10 days. Thereafter, the appearance of the solar cell module taken out of water was visually evaluated. Here, the visual evaluation of the appearance was made according to the following criteria.

A: No change is seen at all in the appearance.

B: A little change is seen in the appearance, and internal peeling can be perceived by touch or peeling can be recognized when the module is disassembled.

C: Peeling has occurred.

The solar cell module on which the high-temperature water immersion test was completed was subjected to an insulation test to measure its insulation resistance. This insulation test was made in the same manner as the insulation test made after the temperature and relative humidity cycle test.

(Measurement of Eyelet Strength)

To measure the eyelet strength, a rope was passed through the hole for handy installation of the solar cell module and a load was applied to its end. The load at which the solar cell module has broken is shown in Table 1.

Example 2

A plurality of solar cell modules were produced in the same manner as in Example 1 except that the light-screening material at the part of the lead-out electrode was not cut off and the same member as the filler resin was inserted between the light-screening material and the lead-out electrode. Thereafter, evaluation was made in the same manner as in Example 1.

Example 3

A plurality of solar cell modules were produced in the same manner as in Example 1 except that the silicone sealant was replaced with a silicone sealant having no fluidity, a hardness after curing of 30 and an breaking extension of 410%. Thereafter, evaluation was made in the same manner as in Example 1.

Example 4

A plurality of solar cell modules were produced in the same manner as in Example 1 except that the silicone sealant was replaced with a silicone sealant having no fluidity, a hardness after curing of 10 and an breaking extension of 140%. Thereafter, evaluation was made in the same manner as in Example 1.

Example 5

A plurality of solar cell modules were produced in the same manner as in Example 1 except that they were produced without use of the solid foaming material and thereafter a foam (a polyethylene foam with a thickness of 3 mm and a foam magnification of 30 times) was laminated using an acrylic emulsion adhesive. Thereafter, evaluation was made in the same manner as in Example 1.

Example 6

A plurality of solar cell modules were produced in the same manner as in Example 1 except that they were produced without use of the solid foaming material. Thereafter, evaluation was made in the same manner as in Example 1.

Comparative Example 1

A plurality of solar cell modules were produced in the same manner as in Example 1 except that the light-screening material was not cut off. Hence, the output lead-out terminals 301 were not covered with the resin. Thereafter, evaluation was made in the same manner as in Example 1.

Comparative Example 2

A plurality of solar cell modules were produced in the same manner as in Example 1 except that the glass fiber nonwoven fabric was used in the same size as the other covering materials so that the glass fiber nonwoven fabric was present also at the portion of output lead-out box fastening holes. Thereafter, evaluation was made in the same manner as in Example 1.

Comparative Example 3

A plurality of solar cell modules were produced in the same manner as in Example 1 except that the light-screening material was replaced with PVF of 12.5 $\mu$m thickness. Thereafter, evaluation was made in the same manner as in Example 1.

TABLE 1

|  |  | Temperature and relative humidity cycle test | | High-temperature water immersion test | | Sea water immersion test | Eyelet strength |
|---|---|---|---|---|---|---|---|
|  |  | Appearance | Leakage current | Appearance | Leakage current |  |  |
| Example | 1 | A | 5 | A | 5 | A | ≧50 kg |
|  | 2 | A | 5 | A | 5 | A | ≧50 kg |
|  | 3 | A | 5 | A | 5 | A | ≧50 kg |
|  | 4 | A | 5 | A | 5 | A | ≧50 kg |
|  | 5 | A | 5 | A | 5 | A | ≧50 kg |
|  | 6 | A | 5 | A | 5 | A | 45 kg |
| Comparative Example | 1 | A | ≧50 | A | ≧50 | C | ≧50 kg |
|  | 2 | C | ≧50 | C | ≧50 | C | ≧50 kg |
|  | 3 | A | 5 | A | 5 | A | 25 kg |

From the results shown in Table 1, the following has been proved.

(a) The solar cell module according to the present invention can be improved in electrical insulating properties because the output lead-out terminals are covered with the resin and have no uncovered portion.

(b) The solar cell module according to the present invention can be improved in electrical insulating properties because the solar cell module edges and the holes for fastening the output lead-out box have no nonwoven fabric.

(c) Since the nonwoven fabric is absent at the module edges, the strength at which the output lead-out box is attached may lower, but the strength can be compensated by providing the light-screening material in a larger layer thickness.

What is claimed is:

1. A solar cell module comprising a photovoltaic device provided between a surface covering material and a back covering material, wherein;

the photovoltaic device has an output lead-out terminal extending out of the photovoltaic device;

the output lead-out terminal is covered with a resin and has no uncovered portion; and the output lead-out terminal is provided with an output lead-out box at its extended portion.

2. The solar cell module according to claim 1, wherein the output lead-out box has a projection, and the projection is inserted to a hole provided in the surface covering material to fasten the box.

3. The solar cell module according to claim 1, wherein at least one of the surface covering material and the back covering material contains a nonwoven fabric, and the solar cell module has no nonwoven fabric at its portion provided with the hole.

4. The solar cell module according to claim 1, wherein the surface covering material has a light-screening material that covers up the photovoltaic device in part.

5. The solar cell module according to claim 4, wherein the light-screening material is provided at the four sides of the photovoltaic device, and the portions at which light-screening materials overlap each other are filled with an adhesive.

6. The solar cell module according to claim 4, wherein the light-screening material has a thickness of from 25 μm to 500 μm.

7. The solar cell module according to claim 1, wherein the surface covering material has a filler resin and a surface film.

8. The solar cell module according to claim 1, wherein the back covering material contains a foam.

9. The solar cell module according to claim 8, wherein the foam is formed by foaming a solid foaming material in the step of covering.

10. The solar cell module according to claim 1, wherein the inside of the output lead-out box is filled with a sealant, and the sealant has a breaking extension of from 100% to 500% after cure.

11. The solar cell module according to claim 1, wherein the inside of the output lead-out box is filled with a sealant, and the sealant has a viscosity of from 30 poises to 5,000 poises.

12. The solar cell module according to claim 1, wherein the resin is a resin that constitutes either the surface covering material or the back covering material.

13. The solar cell module according to claim 1, wherein the output lead-out box is provided on the light-receiving side of the photovoltaic device.

14. A solar cell module comprising:

a photovoltaic device;

a substrate to be provided with the photovoltaic device;

a surface covering material and a back covering material between which are spaced the photovoltaic device and the substrate;

an output lead-out terminal extending out of the photovoltaic device for leading out outputs of the photovoltaic device; and an output lead-out box having an output portion electrically connected to the extending portion of the output lead-out terminal, wherein an exposed portion of the output lead-out terminal is covered with a resin and a nonwoven fabric is provided in the surface covering material or the back covering material such that the nonwoven fabric does not abut a hole provided in the substrate.

15. The solar cell module according to claim 14, wherein the output lead-out box is attached to the solar cell module through the hole.

16. The solar cell module according to claim 14, wherein the inside of the output lead-out box is filled with the resin.

17. The solar cell module according to claim 14, wherein the output lead-out box is provided on the light-receiving side of the photovoltaic device.

18. A solar cell module comprising a photovoltaic device provided between a surface covering material and a back covering material, wherein;

the photovoltaic device has an output lead-out terminal extending out of the photovoltaic device;

the output lead-out terminal is covered with a resin and has no uncovered portion; and the output lead-out terminal is provided with an outside lead-out portion for leading out outputs of the photovoltaic device at its extending portion.

19. The solar cell module according to claim 18, wherein the outside lead-out portion has an output lead-out box, the output lead-out box has a projection, and the projection is inserted into a hole provided in the surface covering material to fasten the box.

20. The solar cell module according to claim 19, wherein at least one of the surface covering material and the back covering material contains a nonwoven fabric, and the nonwoven fabric is not provided at the hole.

21. The solar cell module according to claim 19, wherein the inside of the output lead-out box is filled with a sealant, and the sealant has a breaking extension from 100% to 500% after cure.

22. The solar cell module according to claim 21, wherein the sealant has a viscosity from 30 poises to 5,000 poises.

23. The solar cell module according to claim 19, wherein the output lead-out box is provided on the light-receiving side of the photovoltaic device.

24. The solar cell module according to claim 18, which further comprise a light-screening material that covers up the photovoltaic device in part.

25. The solar cell module according to claim 24, wherein the light-screening material is provided at the periphery of the photovoltaic device, and the portions at which light-screening materials overlap each other are filled with an adhesive.

26. The solar cell module according to claim 24, wherein the light-screening has a thickness from 25 μm to 500 μm.

27. The solar cell module according to claim 18, wherein the surface covering material has a filler resin and a surface film.

28. The solar cell module according to claim 18, wherein the back covering material contains a foam.

29. The solar cell module according to claim 28, wherein the foam is formed by foaming a solid foaming material in the step of covering.

30. The solar cell module according to claim 18, wherein the resin is a resin that constitutes either the surface covering material or the back covering material.

31. A solar cell comprising:

a photovoltaic device a substrate to be provided with the photovoltaic device;

a surface covering material and a back covering material between which are spaced the photovoltaic device and the substrate;

an output lead-out terminal extending out of the photovoltaic device for leading out outputs of the photovoltaic device; and an output portion electrically connected to the extending portion of the output lead-out terminal, wherein an exposed portion of the output lead-out terminal is covered with a resin and a nonwoven fabric is provided in the surface covering material or the back covering material such that the nonwoven fabric does not abut a hole provided in the substrate.

32. The solar cell module according to claim 31, wherein the hole is provided so as to cover the output lead-out terminal and the hole is used for attaching the output lead-out box having the output portion.

33. The solar cell module according to claim 32, wherein the inside of the output lead-out box is filled with the resin.

34. The solar cell module according to claim 32, wherein the output lead-out box is provided on the light-receiving side of the photovoltaic device.

* * * * *

UNITED STATES PATENT AND TRADEMARK OFFICE
CERTIFICATE OF CORRECTION

PATENT NO.  : 6,127,622
DATED       : October 3, 2000
INVENTOR(S) : Satoru Yamada, et al.

It is certified that error appears in the above-identified patent and that said Letters Patent is hereby corrected as shown below:

<u>Title page,</u>
Item [56] "Primary Examiner-Mary Chapman" should read -- Primary Examiner-Mark Chapman --;

<u>Column 1,</u>
Line 35, "(Attachment" should read -- ¶ (Attachment --.

<u>Column 2,</u>
Line 15, "(Solar" should read --¶ (Solar --.

<u>Column 3,</u>
Line 7, "illustrates" should read -- illustrate --;
Line 28, "a" should read -- how a --.

<u>Column 5,</u>
Line 6, "alos" should read -- also --;
Line 55, "has" should read -- have --;
Line 58, close up right margin;
Line 59, close up left margin;
Line 66, "makes" should read -- make --.

<u>Column 6,</u>
Line 52, "spongy" should read -- spongy material --;
Line 56, "spongy" should read -- spongy material --.

UNITED STATES PATENT AND TRADEMARK OFFICE
CERTIFICATE OF CORRECTION

PATENT NO. : 6,127,622
DATED : October 3, 2000
INVENTOR(S) : Satoru Yamada, et al.

It is certified that error appears in the above-identified patent and that said Letters Patent is hereby corrected as shown below:

Column 8,
Line 18, "almost" should read -- mostly --;
Line 32, "ahead," should read -- beforehand, --.

Column 13,
Line 32, "hexamethylene {(2,2,6,6-(tetramethyl -4-" should read -- hexamethylene --;
Line 33, should be deleted;
Line 35, "as" should read -- was --.

Column 15,
Line 24, "steal" should read -- steel --.

Column 20,
Line 15, "extending" should read -- extended --;
Line 35, "comprise" should read -- comprises --
Line 43, "has" should read -- material has --.

Signed and Sealed this

Twenty-first Day of August, 2001

Attest:

*Attesting Officer*

NICHOLAS P. GODICI
*Acting Director of the United States Patent and Trademark Office*